(12) United States Patent
Lee et al.

(10) Patent No.: US 11,552,215 B2
(45) Date of Patent: Jan. 10, 2023

(54) METHOD OF MANUFACTURING DISPLAY DEVICE AND DISPLAY DEVICE

(71) Applicant: Samsung Display Co., Ltd., Yongin-si (KR)

(72) Inventors: Sung Jin Lee, Yongin-si (KR); Jin Yeong Kim, Yongin-si (KR); Jin Taek Kim, Yongin-si (KR); Mi Jin Park, Yongin-si (KR); Sang Ho Park, Yongin-si (KR); Tae Hoon Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 90 days.

(21) Appl. No.: 16/937,255

(22) Filed: Jul. 23, 2020

(65) Prior Publication Data

US 2021/0111303 A1 Apr. 15, 2021

(30) Foreign Application Priority Data

Oct. 15, 2019 (KR) .................. 10-2019-0128017

(51) Int. Cl.
*H01L 33/00* (2010.01)
*H01L 31/12* (2006.01)
(Continued)

(52) U.S. Cl.
CPC ...... *H01L 33/0095* (2013.01); *H01L 25/0753* (2013.01); *H01L 33/405* (2013.01);
(Continued)

(58) Field of Classification Search
CPC ............. H01L 33/0095; H01L 25/0753; H01L 33/405; H01L 33/42; H01L 2933/0016;
(Continued)

(56) References Cited

U.S. PATENT DOCUMENTS 8,895,955 B2 11/2014 Kim et al.
10,211,418 B2 2/2019 Im et al.
(Continued)

FOREIGN PATENT DOCUMENTS

KR 10-1496151 B1 2/2015
KR 10-2018-0009015 A 1/2018
KR 10-2019-0006430 A 1/2019

*Primary Examiner* — Ismail A Muse
(74) *Attorney, Agent, or Firm* — Lewis Roca Rothgerber Christie LLP

(57) ABSTRACT

A method of manufacturing a display device includes: forming a first electrode on a substrate; forming an insulating layer on the substrate and on the first electrode; providing light emitting elements in the insulating layer, each of the light emitting elements having a long axis and a short axis crossing the long axis and being configured to emit light; aligning the light emitting elements such that one end of each of the light emitting elements faces the substrate and the long axis of each of the light emitting elements is arranged in a direction from the substrate toward the insulating layer; patterning the insulating layer to form an insulating pattern exposing another end of each of the light emitting elements; and forming a second electrode electrically connected to the exposed other end of each of the light emitting elements.

11 Claims, 7 Drawing Sheets

(51) Int. Cl.
*H01L 29/26* (2006.01)
*H01L 27/15* (2006.01)
*H01L 25/075* (2006.01)
*H01L 33/40* (2010.01)
*H01L 33/42* (2010.01)

(52) U.S. Cl.
CPC ...... *H01L 33/42* (2013.01); *H01L 2933/0016* (2013.01); *H01L 2933/0058* (2013.01); *H01L 2933/0066* (2013.01)

(58) Field of Classification Search
CPC ..... H01L 2933/0058; H01L 2933/0066; H01L 33/60; H01L 33/62; H01L 25/167; H01L 27/156; H01L 33/005; H01L 33/36
See application file for complete search history.

(56) References Cited

U.S. PATENT DOCUMENTS

| | | | |
|---|---|---|---|
| 2018/0182746 A1* | 6/2018 | Bibl | H01L 33/06 |
| 2018/0219162 A1* | 8/2018 | Tang | H01L 27/3267 |
| 2021/0082886 A1* | 3/2021 | Brick | H01L 33/505 |
| 2021/0376187 A1* | 12/2021 | Knisley | H01L 33/0095 |
| 2022/0231080 A1* | 7/2022 | Li | H01L 27/1255 |

* cited by examiner

METHOD OF MANUFACTURING DISPLAY DEVICE AND DISPLAY DEVICE

CROSS-REFERENCE TO RELATED APPLICATION

The application claims priority to and the benefit of Korean Patent Application No. 10-2019-0128017, filed on Oct. 15, 2019 in the Korean Intellectual Property Office, the entire contents of which are hereby incorporated by reference as if fully set forth herein.

BACKGROUND

1. Field

Aspects of embodiments of the present invention relate to a method of manufacturing a display device and a display device.

2. Related Art

Light emitting diodes (hereinafter referred to as LEDs) exhibit relatively good durability even under adverse environmental conditions and have excellent performance in terms of lifetime and luminance. In recent years, research has been conducted for applying such LEDs to various display devices.

As a part of this research, a technique for manufacturing ultra-small rod-like LEDs, such as on a microscale or a nanoscale, using an inorganic crystal structure, for example, a structure in which a nitride-based semiconductor is grown, is being developed. The rod-like LEDs may be manufactured to be small enough (e.g., to have a small enough size) to constitute a pixel or the like of a self-emissive display device.

SUMMARY

According to embodiments of the present invention, a simplified method of manufacturing a display device and a display device having a simplified manufacturing process are provided.

According to an embodiment, a method of manufacturing a display device includes: forming a first electrode on a substrate; forming an insulating layer on the substrate and on the first electrode; providing light emitting elements in the insulating layer, each of the light emitting elements having a long axis and a short axis crossing the long axis and being configured to emit light; aligning the light emitting elements such that one end of each of the light emitting elements faces the substrate and the long axis of each of the light emitting elements is arranged in a direction from the substrate toward the insulating layer; patterning the insulating layer to form an insulating pattern exposing another end of each of the light emitting elements; and forming a second electrode electrically connected to the exposed other end of each of the light emitting elements.

The forming of the first electrode may include: forming a reflective layer on the substrate; and forming a transparent conductive layer on the reflective layer.

The forming of the insulating layer may include applying a photoresist composition on the substrate and on the first electrode.

The forming of the insulating layer and the providing of the light emitting elements may be concurrently performed by using the photoresist composition comprising the light emitting elements.

The patterning of the insulating layer to form the insulating pattern may include selectively exposing and developing the insulating layer by using a mask.

The patterning of the insulating layer to form the insulating pattern may include using a halftone mask or a slit mask to form the insulating pattern.

The method of claim 1, wherein the aligning the light emitting elements may include: disposing an alignment electrode over the insulating layer; and applying power to each of the first electrode and the alignment electrode to align the light emitting elements such that the one end of each of the light emitting elements faces the substrate and the other end of each of the light emitting elements faces the alignment electrode.

The patterning of the insulating layer to form the insulating pattern may include forming the insulating pattern in each pixel region of the substrate.

The method may further include drying the insulating layer under reduced pressure to fix the aligned light emitting elements after the aligning of the light emitting elements.

The method may further include heat-treating the insulating layer between the drying of the insulating layer and the patterning of the insulating layer.

The method may further include removing the light emitting elements in a region outside of pixel regions of the substrate before the heat-treating of the insulating layer.

The method may further include curing the insulating pattern before the forming the second electrode.

According to an embodiment, a display device includes: a substrate; a first electrode on the substrate; an insulating pattern on the first electrode; a plurality of light emitting elements, each of the light emitting elements having one end facing the substrate and another end exposed by the insulating pattern; and a second electrode electrically connected to the exposed other end of each of the light emitting elements. Each of the light emitting elements has a long axis and a short axis crossing the long axis, the insulating pattern supports the light emitting elements such that the long axis of each of the light emitting elements is aligned in a direction from the substrate toward the insulating pattern, and the insulating pattern includes a cured product of photoresist composition.

Light emitted by the light emitting elements may be emitted toward the second electrode.

The first electrode may include a reflective layer on the substrate and a transparent conductive layer on the reflective layer, the second electrode may be a transparent electrode, and the reflective layer may reflect light emitted from the light emitting elements toward the second electrode.

BRIEF DESCRIPTION OF THE DRAWINGS

The accompanying drawings, which are included to provide a further understanding of the inventive concepts, are incorporated in and constitute a part of this specification, illustrate exemplary embodiments of the inventive concepts, and, together with the description, explain aspects and features of the inventive concepts.

DETAILED DESCRIPTION

Figure 1A:
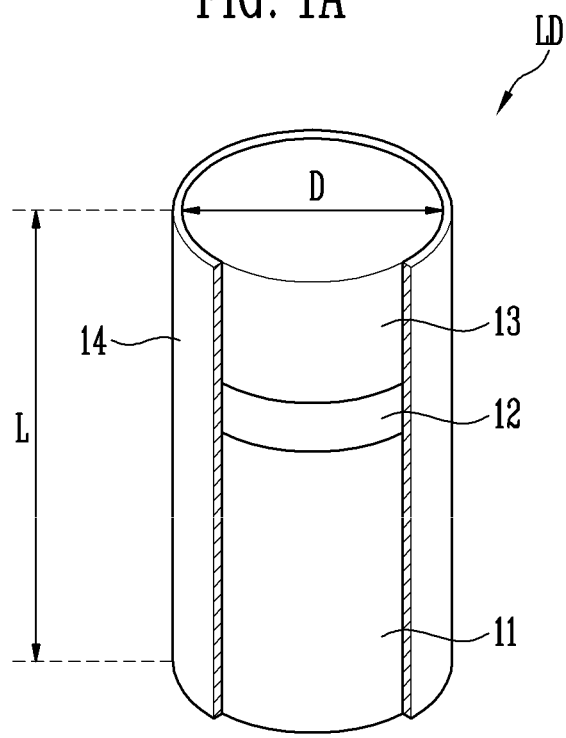
FIGS. 1A and 1B are perspective views illustrating a light emitting element according to embodiments of the present invention.

Reference will now be made, in detail, to various embodiments of the present invention, specific examples of which are illustrated in the accompanying drawings and are described below. However, the embodiments of the present invention may be variously modified to have many different forms such that these descriptions are not intended to limit the present invention to particular modes of practice. It is to be appreciated that all changes, equivalents, and substitutes that do not depart from the spirit and technical scope of the present disclosure are encompassed in the present disclosure.

Throughout the disclosure, like reference numerals refer to like components throughout the various figures and embodiments of the present disclosure. The sizes of elements in the accompanying drawings may be exaggerated for clarity of illustration.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of the stated features, integers, steps, operations, elements, components, and/or combinations thereof but do not preclude the presence or addition of one or more other features, integers, steps, operations, elements, components, and/or combinations thereof. Furthermore, when a first part, such as a layer, a film, a region, or a plate is disposed on a second part, the first part may be not only directly on the second part but a third part may intervene between them. In addition, when it is expressed that a first part, such as a layer, a film, a region, or a plate is formed on a second part, the surface of the second part on which the first part is formed is not limited to an upper surface of the second part but may include other surfaces, such as a side surface or a lower surface of the second part. When a first part, such as a layer, a film, a region, or a plate is under a second part, the first part may be not only directly under the second part but a third part may intervene between them. Further, as used herein, the singular forms "a" and "an" are intended to include the plural forms as well, unless the context clearly indicates otherwise.

Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Hereinafter, exemplary embodiments of the present invention will be described, in detail, with reference to the accompanying drawings.

A display device manufactured according to a method of manufacturing a display device according to an embodiment of the present invention may include a substrate SUB, a pixel circuit layer PCL including a plurality of transistors, and a display element layer DPL including a plurality of light emitting elements LD.

Figure 1B:
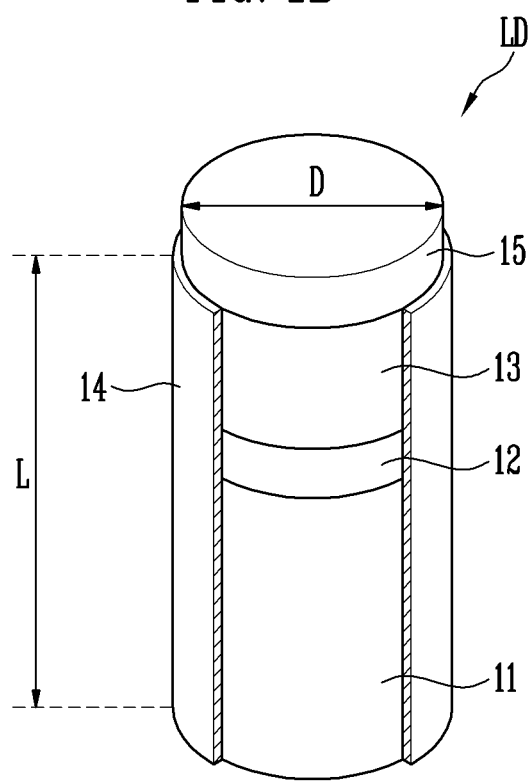

FIGS. 1A and 1B are perspective views illustrating a light emitting element according to embodiments of the present invention. Although the light emitting element LD shown in FIGS. 1A and 1B has a circular columnar shape, the present invention is not limited thereto.

Referring to FIGS. 1A and 1B, the light emitting element LD according to an embodiment of the present invention may include a first semiconductor layer 11, a second semiconductor layer 13, and an active layer 12 interposed between the first semiconductor layer 11 and the second semiconductor layer 13.

For example, the light emitting element LD may be implemented as a laminate structure in which the first semiconductor layer 11, the active layer 12, and the second semiconductor layer 13 are sequentially stacked (e.g., sequentially stacked on each other).

According to an embodiment of the present invention, the light emitting element LD may be provided in a rod shape extending in one direction. For example, the light emitting element LD may include a long axis L and a short axis D crossing (e.g., perpendicular to) the long axis L. When the extending direction of the light emitting element LD is called a longitudinal direction, the long axis L of the light emitting element LD may be formed along the longitudinal direction. In addition, the light emitting element LD may have one end and another end along the longitudinal direction.

In an embodiment of the present invention, one of the first semiconductor layer 11 and the second semiconductor layer 13 may be disposed at the one end, and the other one of the first semiconductor layer 11 and the second semiconductor layer 13 may be disposed at the other end.

In an embodiment of the present invention, the light emitting element LD may be provided in the rod shape. Here, the term "rod shape" may mean a rod-like shape or a bar-like shape that is long in the longitudinal direction (that is, having an aspect ratio greater than 1), such as a cylinder, a polygonal column, or the like. For example, the long axis L (for example, the length) of the light emitting element LD may be larger than the short axis D (for example, the diameter or width) thereof.

For example, the light emitting element LD may be manufactured to be small enough such that its diameter and/or length is on a micro scale (e.g., in a range of about 1 μm to about 1,000 μm) or a nano scale (e.g., in a range of about 1 nm to about 1,000 nm).

However, the size of the light emitting element LD is not limited thereto, and the size of the light emitting element LD may be suitably changed according to the display device to which the light emitting element LD is applied.

The first semiconductor layer 11 may include at least one n-type semiconductor layer. For example, the first semiconductor layer 11 may include any suitable semiconductor material(s), such as InAlGaN, GaN, AlGaN, InGaN, AlN, and InN, and may be doped with a first conductive dopant, such as Si, Ge, Sn, or the like.

The first semiconductor layer 11 is not limited to the above-described materials, and the first semiconductor layer 11 may be formed of various other suitable materials.

The active layer 12 may be formed on the first semiconductor layer 11 and may have a single or multiple quantum well structure. In various embodiments of the present invention, a cladding layer doped with a conductive dopant may be formed on and/or under the active layer 12. For example, the cladding layer may be implemented as (or may be) an AlGaN layer or an InAlGaN layer. Other suitable materials, such as AlGaN and AlInGaN, may be used as the active layer 12.

When an electric field equal to or greater than a predetermined voltage is applied to both ends of the light emitting element LD, the light emitting element LD may emit light by a combination of electron-hole pairs in the active layer 12.

The second semiconductor layer 13 may be provided on the active layer 12 and may include a semiconductor layer of a different type than the first semiconductor layer 11. For example, the second semiconductor layer 13 may include at least one p-type semiconductor layer. For example, the second semiconductor layer 13 may include any suitable semiconductor material(s), such as InAlGaN, GaN, AlGaN, InGaN, AlN, and InN, and may be doped with a second conductive dopant, such as Mg.

The second semiconductor layer 13 is not limited to the above-described materials, and the second semiconductor layer 13 may be formed of various other suitable materials.

According to an embodiment of the present invention, the light emitting element LD may further include a phosphor layer, another active layer, another semiconductor layer, and/or an electrode layer formed on and/or under each of the first semiconductor layer 11, the active layer 12, and the second semiconductor layer 13.

In an embodiment of the present invention, the light emitting element LD may further include at least one electrode layer disposed at one end (e.g., an upper surface) of the second semiconductor layer 13 or at one end (e.g., a lower surface) of the first semiconductor layer 11.

The light emitting element LD shown in FIG. 1B further includes an electrode layer 15 disposed on the one end of the second semiconductor layer 13. The electrode layer 15 may be an ohmic contact electrode, but the present invention is not limited thereto. In addition, the electrode layer 15 may include a metal or a metal oxide. For example, the electrode layer 15 may include chromium (Cr), titanium (Ti), aluminum (Al), gold (Au), nickel (Ni), ITO, oxides, and/or alloys thereof. The above-described materials may be used alone or in combination, but the present invention is not limited thereto. The electrode layer 15 may be substantially transparent or translucent. Accordingly, light generated by the light emitting element LD may penetrate (e.g., may be transmitted by) the electrode layer 15 and may be emitted to the outside of the light emitting element LD.

The light emitting element LD may further include an insulating film 14. In an embodiment of the present invention, the insulating film 14 may be provided to cover a portion of the first semiconductor layer 11, the active layer 12, and the second semiconductor layer 13. However, according to another embodiment of the present invention, the insulating film 14 may be omitted.

For example, the insulating film 14 may be provided at a portion other than the both ends of the light emitting element LD such that the both ends of the light emitting element LD may be exposed (e.g., may be exposed by the insulating film 14).

For convenience of description, FIGS. 1A and 1B show a state in which a portion of the insulating film 14 is removed to illustrate the underlying layers. However, all sides of the light emitting element LD may be surrounded by the insulating film 14.

The insulating film 14 may be provided to surround at least a portion of an outer circumferential surface of (e.g., a peripheral surface of) the first semiconductor layer 11, the active layer 12, and/or the second semiconductor layer 13. For example, the insulating film 14 may be provided to surround at least the outer circumferential surface of the active layer 12. In addition, when the light emitting element LD includes the electrode layer 15, the insulating film 14 may be provided to surround at least a portion of an outer circumferential surface of the electrode layer 15.

According to an embodiment of the present invention, the insulating film 14 may include (or may be formed of) a transparent insulating material. For example, the insulating film 14 may include one or more insulating materials selected from the group consisting of $SiO_2$, $Si_3N_4$, $Al_2O_3$, and $TiO_2$. However, the present invention is not limited thereto, and the insulating film 14 may include (or may be formed of) various other suitable materials having insulating properties.

When the insulating film 14 is provided to the light emitting element LD, the active layer 12 may not be shorted to first and/or second electrodes.

In addition, by forming the insulating film 14, surface defects of the light emitting element LD may be reduced or minimized, thereby improving lifetime and efficiency of the light emitting element LD. In addition, when a plurality of light emitting elements LD are disposed closely to each other, the insulating film 14 may reduce or prevent unwanted or undesirable short circuits that may occur between adjacent light emitting elements LD.

The light emitting element LD may be used as a light emitting source in various display devices. For example, the light emitting element LD may be used as a light source element of a lighting device or a self-emissive display device.

FIGS. 2A to 2G are cross-sectional views sequentially illustrating a method of manufacturing a display device according to an embodiment of the present invention.

Figure 2A:
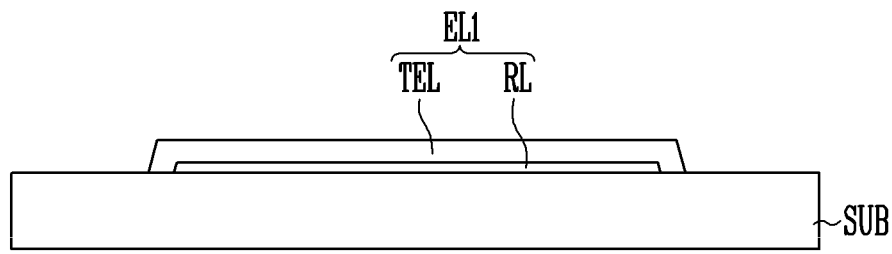
FIGS. 2A to 2G are cross-sectional views sequentially illustrating a method of manufacturing a display device according to an embodiment of the present invention.

Referring to FIG. 2A, in an embodiment of the present invention, a first electrode EL1 may be provided on one surface of the substrate SUB.

The substrate SUB may include a transparent insulating material to transmit light. In addition, the substrate SUB may be a rigid substrate or a flexible substrate. The rigid substrate may include a glass substrate, a quartz substrate, a glass ceramic substrate, and/or a crystalline glass substrate.

The flexible substrate may include a film substrate including a polymer organic material and/or a plastic substrate. For example, the flexible substrate may include one of polyethersulfone (PES), polyacrylate, polyetherimide (PEI), polyethylene naphthalate (PEN), polyethylene terephthalate (PET), Polyphenylene sulfide (PPS), polyarylate (PAR), polyimide (PI), polycarbonate (PC), triacetate cellulose (TAC), and cellulose acetate propionate (CAP). In addition, the flexible substrate may include fiber glass reinforced plastic (FRP).

The material applied to the substrate SUB may be resistant to (e.g., may have heat resistance) to a high processing temperature in the manufacturing process of the display device. In various embodiments of the present invention, the substrate SUB may have flexibility in whole or in at least a part thereof.

Referring to FIG. 2A, in a process of providing (e.g., forming) the first electrode EL1, a reflective layer RL may be formed on the substrate SUB, and a transparent conductive layer TEL may be formed on the reflective layer RL. For example, the first electrode EL1 may include the reflective layer RL and the transparent conductive layer TEL. The transparent conductive layer TEL may cover the reflective layer RL so that the reflective layer RL is not exposed. In such an embodiment, the transparent conductive layer TEL and the reflective layer RL may be electrically connected to each other.

According to an embodiment of the present invention, a material for forming the reflective layer may be deposited on the substrate SUB to form the reflective layer RL, and a material for forming the transparent conductive layer may be deposited on the reflective layer RL and the substrate SUB to form the transparent conductive layer TEL.

According to various embodiments of the present invention, the reflective layer RL may be formed on the substrate SUB in the process of providing (e.g., forming) the first electrode EL1. In some embodiments, the transparent conductive layer TEL may be omitted according to the design of the display device. By omitting the transparent conductive layer TEL, the number of masks used to form the first electrode EL1 may be reduced.

Hereinafter, for convenience of description, an embodiment in which the first electrode EL1 includes the reflective layer RL and the transparent conductive layer TEL will be described.

Figure 2B:
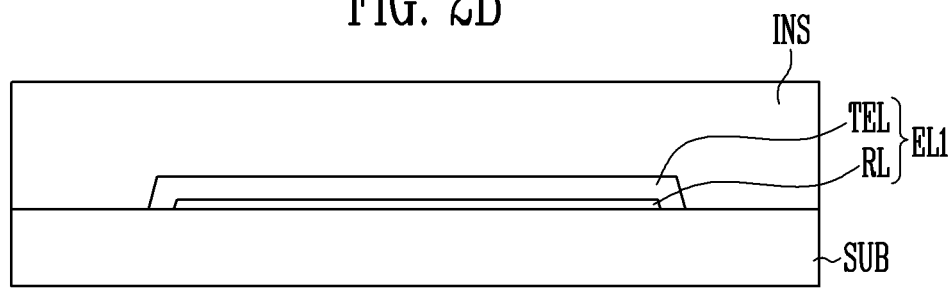

Referring to FIG. 2B, an insulating layer INS may be formed on the substrate SUB including the first electrode EL1. According to an embodiment of the present invention, in a process of forming the insulating layer INS, the insulating layer INS may be formed by applying a photoresist composition on the first electrode EL1 and the substrate SUB. In such an embodiment, the photoresist composition may be applied to the entire surface of the substrate SUB.

The photoresist composition may include suitable components used to form a photoresist as known in the art and is not particularly limited. For example, the photoresist composition may include an organic polymer, a solvent, a photosensitive agent, or the like, which may form an insulating pattern INSP, which will be described below. However, the components included in the photoresist composition are not particularly limited. In some embodiments, the photoresist composition may further include additives, such as colorants, dyes, anti-scratching agents, plasticizers, adhesion promoters, and the like. For example, the photoresist composition may further include a surfactant to reduce or minimize defects that may occur during coating (e.g., application) and to improve coating properties.

As a method of applying the photoresist composition, conventional spinless coating, roll coating, spin coating, slit-and-spin coating, slit coating, etc. may be used, but the method of applying the photoresist composition is not limited thereto.

Figure 2C:
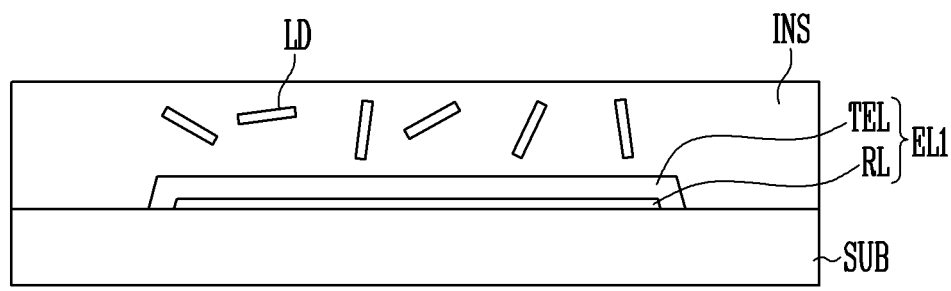

Referring to FIG. 2C, a plurality of light emitting elements LD that emit light may be provided in the insulating layer INS. The insulating layer INS may be formed by applying the photoresist composition, which may be in a liquid form having a viscosity (e.g., a predetermined viscosity). To provide the light emitting elements LD in the insulating layer INS, for example, a solution including the light emitting elements LD may be printed on the insulating layer INS or a solution including the light emitting elements LD may be injected into the insulating layer INS. However, the method of providing the light emitting elements LD in the insulating layer INS is not limited thereto.

According to an embodiment of the present invention, in a process of providing the light emitting elements LD, the light emitting elements LD may be provided in portions (or regions) of the insulating layer INS overlapping (e.g., over) pixel regions of the substrate SUB.

As will be described in more detail below, the light emitting elements LD may be aligned and positioned on (e.g., over) the pixel regions of the substrate SUB, and the light emitting elements LD in portions (or regions) other than (e.g., offset from or outside of) the pixel regions may act as foreign matter in a subsequent process. However, according to an embodiment of the present invention, the light emitting elements LD may be selectively provided only on the pixel regions of the substrate SUB. Because the light emitting elements LD are not provided in a portion (e.g., an area) other than on (e.g., over) the pixel regions, the subsequent process can be performed more easily.

According to an embodiment of the present invention, by forming the insulating layer INS by using the photoresist composition including the light emitting elements LD, the process of forming the insulating layer INS and the process of providing the light emitting elements LD may be performed concurrently (e.g., simultaneously). As a result, the manufacturing process of the display device can be simplified.

When the photoresist composition including the light emitting elements LD is applied on one surface of the substrate SUB, the light emitting elements LD may be applied in portions (or regions) other than the pixel regions. However, according to an embodiment of the present invention, the light emitting elements LD remaining in the portions other than the pixel regions may be removed through a cleaning process, which will be described below.

Figure 2D:
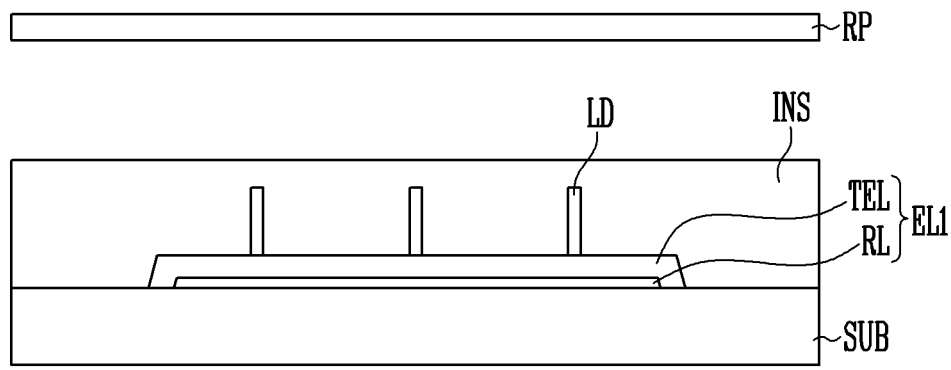

Referring to FIG. 2D, in a process of aligning the light emitting elements LD, an alignment electrode RP may be disposed on (or over) the insulating layer INS, and power may be applied to each of the first electrode EL1 and the alignment electrode RP. When an alignment voltage is applied to the first electrode EL1 and an alignment voltage is applied to the alignment electrode RP, self-alignment of the light emitting elements LD may be induced by an electric field formed between the alignment electrode RP and the first electrode EL1. When the first electrode EL1 includes the reflective layer RL and the transparent conductive layer TEL, the alignment voltage may be applied to the reflective layer RL and the alignment electrode RP, respectively.

As the light emitting elements LD included in the insulating layer INS are self-aligned, one end of the light emitting elements LD may face the substrate SUB, and the other end of the light emitting elements LD may face the alignment electrode RP. For example, in the insulating layer INS, the long axis L of the light emitting elements LD may be aligned along a direction from the substrate SUB toward the insulating layer INS.

FIG. 2D shows a state in which the long axis L of the light emitting elements LD is aligned at a vertical angle with the substrate SUB, but the alignment form of the light emitting elements LD is not limited thereto. For example, the long axis L of the light emitting elements LD may be aligned to be inclined at an angle (e.g., a predetermined angle) with respect the substrate SUB.

According to an embodiment, the method of manufacturing the display device may further include a process of fixing the aligned light emitting elements LD by drying the insulating layer INS under reduced pressure after the process of aligning the light emitting elements LD.

In the insulating layer INS, the long axis L of the light emitting elements LD may be aligned to cross (e.g., to extend toward) the substrate SUB. The insulating layer INS may include a solvent used in the photoresist composition. When the insulating layer INS is dried under reduced pressure, the solvent in the insulating layer INS may be evaporated to solidify the insulating layer INS. As a result, the light emitting elements LD may be fixed in an aligned state in the insulating layer INS from which the solvent has been evaporated. For example, by drying the insulating layer INS under reduced pressure, the light emitting elements LD may be temporarily fixed in position, and the aligned light emitting elements LD may be completely fixed by forming the insulating pattern INSP, which will be described below.

According to an embodiment of the present invention, the method of manufacturing the display device may further include a process of removing the light emitting elements LD remaining in an outer region of (e.g., at a region outside or offset from) the pixel regions of the substrate SUB. The process of removing the light emitting elements LD may be performed before a process of heat-treating the insulating layer INS, which will be described below.

In the insulating layer INS, the light emitting elements LD overlapping the pixel regions of the substrate SUB may be aligned in a standing (or vertical) state with respect to the substrate SUB, and the light emitting elements LD overlapping the outer regions other than the pixel regions of the substrate SUB may remain in an unaligned state (e.g., may not be aligned).

According to an embodiment of the present invention, the light emitting elements LD remaining in the outer region may be removed such that the light emitting elements LD do not remain as foreign matters in subsequent processes. Therefore, precision of the subsequent processes may be improved and the process difficulty of the subsequent process may be lowered.

In order to remove the light emitting elements LD remaining in the outer region, for example, a cleaning process may be performed using the same solvent as the solvent included in the photoresist composition. However, the method of removing the light emitting elements LD is not limited thereto.

According to an embodiment of the present invention, the method of manufacturing the display device may further include the process of heat-treating the insulating layer INS, which is performed between the process of fixing the light emitting elements LD and the process of forming the insulating pattern INSP. For example, after removing the light emitting elements LD remaining in the outer regions of the pixel regions, the insulating layer INS may be heat treated.

By heat-treating the insulating layer INS, the solvent remaining that did not evaporate when the insulating layer INS was dried under the reduced pressure may be entirely (or substantially entirely) removed. The process of heat-treating the insulating layer INS may be performed at a temperature of about 80° C. to about 120° C. However, the temperature for heat treatment is not limited thereto.

The temperature for heat treatment of the insulating layer INS may be set according to a boiling point of the solvent included in the photoresist composition and may be adjusted to a temperature at which the solvent remaining in the insulating layer INS is completely removed. Because the solvent remaining in the insulating layer INS is completely (or substantially completely) removed, subsequent exposure and development processes of the insulating layer INS may be smoothly performed.

Figure 2E:
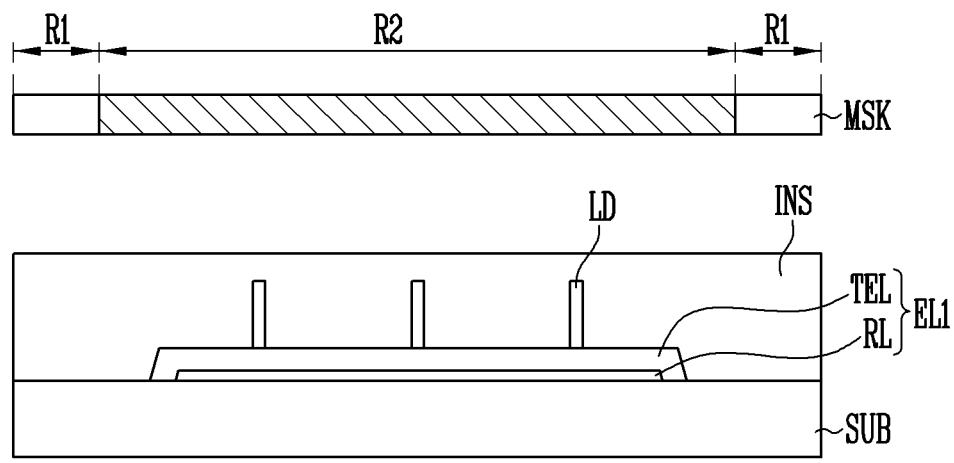

Referring to FIG. 2E, according to an embodiment of the present invention, the insulating layer INS may be selectively exposed and developed by using a mask MSK to form the insulating pattern INSP. The insulating pattern INSP may expose the other end of the light emitting elements LD and may be formed by exposing and developing the insulating layer INS formed of the photoresist composition by using the mask MSK. The insulating pattern INSP may reduce or prevent the light emitting elements LD from being separated from the aligned positions (e.g., may reduce the occurrence of the light emitting elements LD becoming un-aligned).

According to an embodiment of the present invention, in the process of forming the insulating pattern INSP, the insulating pattern INSP may be formed by using a halftone mask MSK or a slit mask. FIG. 2E shows the insulating pattern INSP being formed to expose the other end of the light emitting elements LD by using the halftone mask MSK. However, the insulating pattern INSP may be formed to expose the other end of the light emitting elements LD by using a slit mask.

Referring to FIG. 2E, a first region R1 of the halftone mask MSK may be a region that blocks all (or substantially all) of the irradiated light, and a second region R2 of the halftone mask MSK may be a region which transmits only a portion (e.g., only some) of the irradiated light by applying halftones and blocks another portion (e.g., some) of the irradiated light.

Figure 2F:
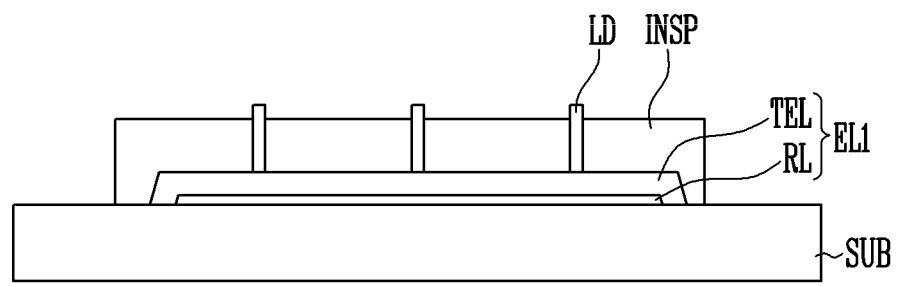

When the insulating layer INS exposed through the halftone mask MSK is developed, as shown in FIG. 2F, a portion of (e.g., a portion of one surface of) the substrate SUB under the first region R1 of the halftone mask MSK, in which all of the irradiated light is blocked, may be exposed, and a portion of the insulating pattern INSP under the second region R2 of the halftone mask MSK, in which only a portion of the irradiated light is blocked, may be formed to expose the other end of the light emitting elements LD.

According to an embodiment of the present invention, in the process of forming the insulating pattern INSP, the insulating pattern INSP may be formed in each of the pixel regions. Because the insulating pattern INSP fixing the light emitting elements LD is provided in each of the pixel regions, light emitting regions of the pixels may be distinguished from (e.g., separate or spaced from) each other. As the insulating pattern INSP is provided in each of the pixel regions, a bank used to distinguish light emitting regions in a conventional display device may be omitted. Accordingly, in the embodiment of the present invention, a mask for forming the bank may be omitted in comparison with a manufacturing process of the conventional display device.

According to an embodiment of the present invention, the method of manufacturing the display device may further include a process of curing the insulating pattern INSP that is performed before a process of forming a second electrode EL2.

In the process of curing the insulating pattern INSP, for example, the insulating pattern INSP may be cured by heat-treating the insulating pattern INSP to induce thermal cross-linking reaction between the organic polymer and the photosensitive agent included in the insulating pattern INSP. The process of curing the insulating pattern INSP may be performed at a temperature of about 200° C. to about 250° C. However, the temperature for curing the insulating pattern INSP is not limited thereto and may be set differently according to types (or kinds) of the organic polymer and the photosensitive agent included in the insulating pattern INSP.

Figure 2G:
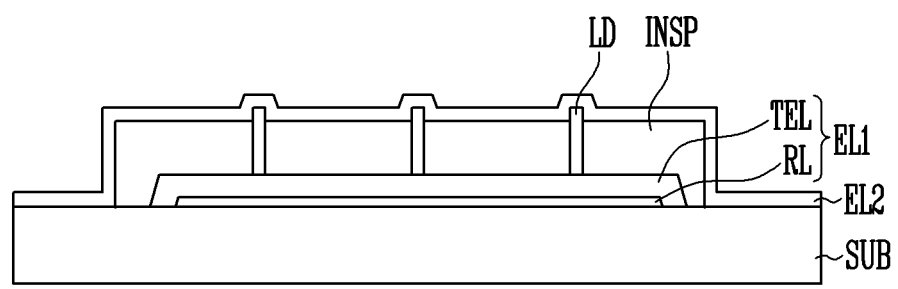

Referring to FIG. 2G, the second electrode EL2 may be formed to be electrically connected to the other end of the light emitting elements LD exposed by the cured insulating pattern INSP. For example, the second electrode EL2 may be provided to cover the other end of the light emitting elements LD and may be electrically connected to the light emitting elements LD.

According to an embodiment of the present invention, the pixel circuit layer PCL including the plurality of transistors is provided on the substrate SUB, and the first electrode EL1, the insulating pattern INSP, the light emitting elements LD, and the second electrode EL2 may be provided on the pixel circuit layer PCL. In such an embodiment, the first electrode EL1 may be electrically connected to at least one of the plurality of transistors, and the second electrode EL2 may be electrically connected to a driving voltage line DVL included in the pixel circuit layer PCL. A detailed description of the structure of the pixel circuit layer PCL will be provided below.

According to an embodiment of the present invention, an overcoat layer OC may be formed on the second electrode EL2. The overcoat layer OC may be an encapsulation layer that prevents (or substantially prevents) oxygen, moisture, and the like from penetrating into the light emitting elements LD.

According to the embodiment of the present invention, the number of masks used in the manufacturing process of the display device can be effectively reduced.

In general, a conventional display device may include a structure in which a substrate, a pixel circuit layer provided on one surface of the substrate, and a display element layer provided on the pixel circuit layer are sequentially stacked.

A process of forming the display element layer of a conventional display device may generally include a process of forming a reflective partition on the pixel circuit layer, a process of forming an alignment line on the reflective partition, a process of forming a first insulating layer on the alignment line, a process of forming a bank, a process of aligning light emitting elements, a process of forming a second insulating layer on the light emitting elements, a process of etching the second insulating layer, a process of forming a first contact electrode at one end of the light emitting elements exposed by the etched second insulating layer, a process of forming a third insulating layer on the first contact electrode, a process of etching the third insulating layer, and a process of forming a second contact electrode at the other end of the light emitting elements exposed by the etched third insulating layer. Masks may be used in each process.

On the other hand, as compared with the method of manufacturing a conventional display device described above, in the method of manufacturing the display device according to embodiments of the present invention, for example, the process of forming the reflective partition, the process of forming the bank, the process of forming the second insulating layer, the process of etching the second insulating layer, the process of forming the third insulating layer, and the process of etching the third insulating layer may be omitted. Therefore, the number of masks used for manufacturing the display device can be effectively reduced.

Figure 3:
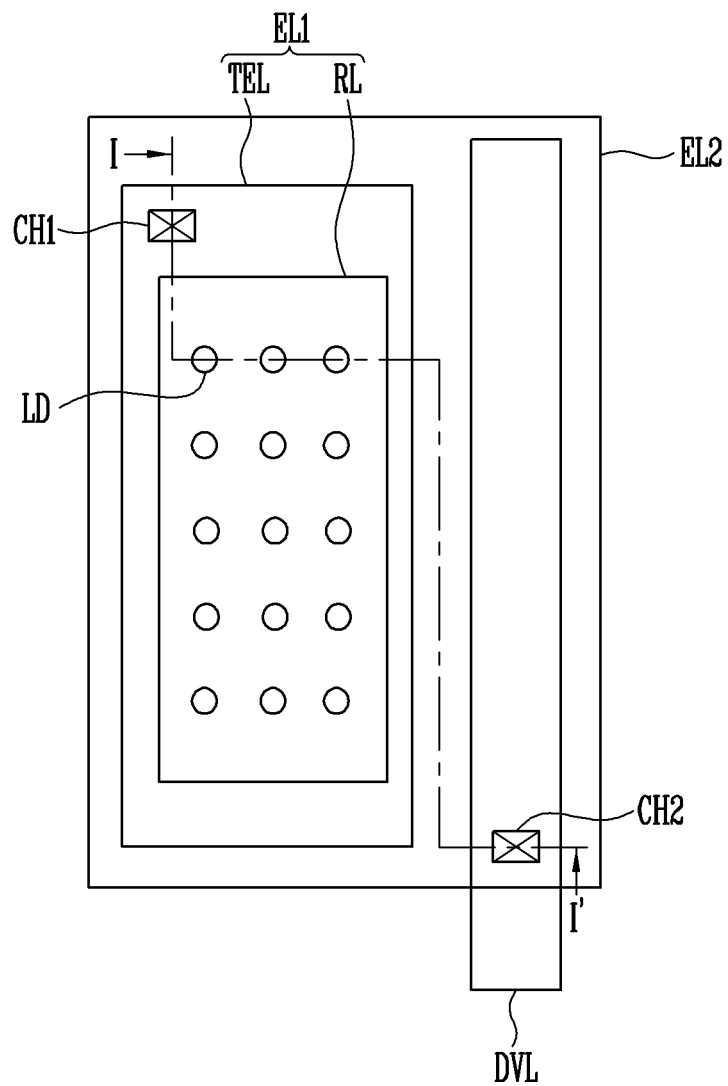
FIG. 3 is a plan view illustrating a unit light emitting region of a display element layer including the light emitting element shown in FIG. 1A or 1B according to an embodiment of the present invention.
Figure 4:
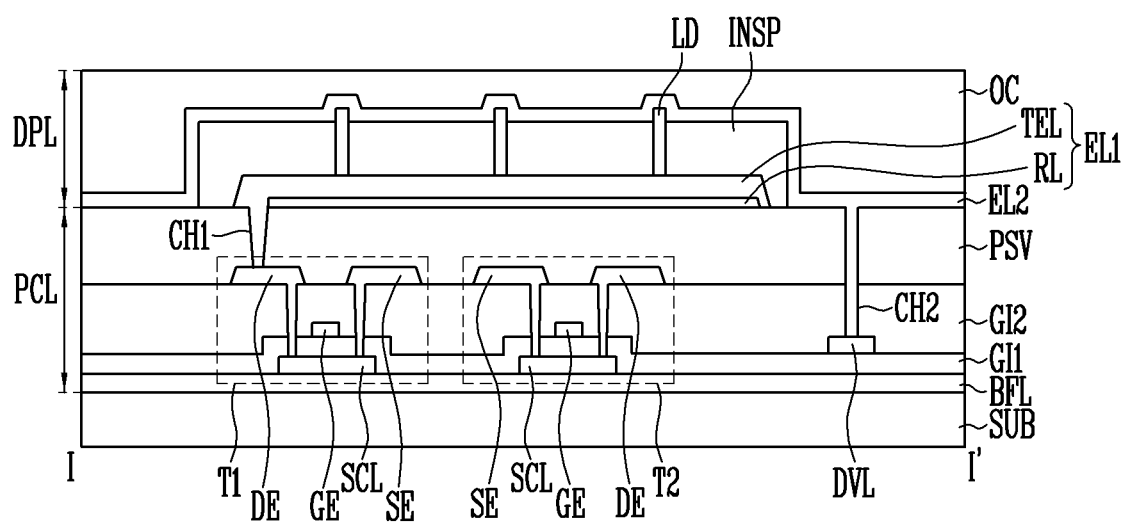
FIG. 4 is a cross-sectional view along the line I-I' of FIG. 3.
Figure 5A:
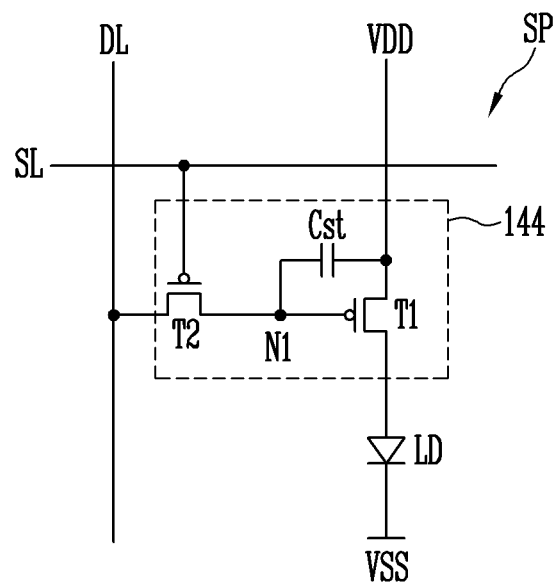
FIGS. 5A to 5C are circuit diagrams illustrating a unit light emitting region of the display device according to embodiments of the present invention.
Figure 5B:
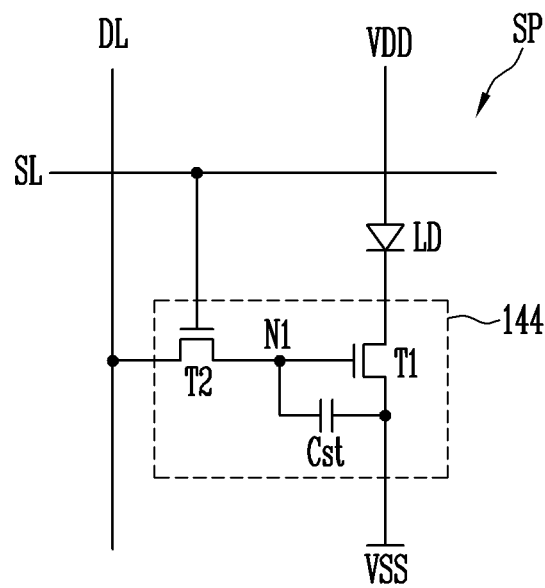
Figure 5C:
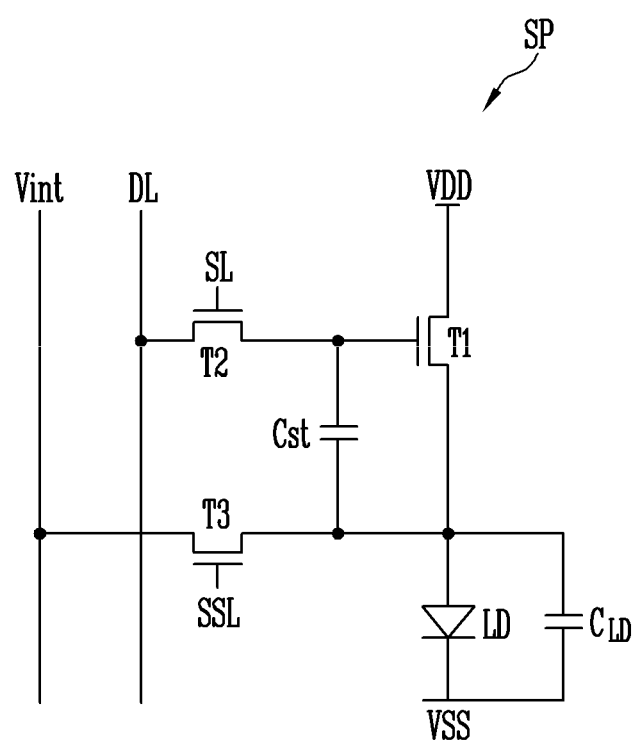

FIG. 3 is a plan view illustrating a unit light emitting region of a display element layer according to an embodiment of the present invention including the light emitting element of FIG. 1A or 1B. FIG. 4 is a cross-sectional view illustrating the display device according to the embodiment of the present invention along line I-I' of FIG. 3. FIG. 5A to FIG. 5C are circuit diagrams illustrating the unit light emitting region of the display device according to the embodiment of the present invention. In FIG. 3, the insulating pattern INSP, which will be described below, is omitted for convenience of illustration.

FIG. 3 shows that the light emitting elements LD are regularly arranged, but the arrangement of the light emitting elements LD is not limited thereto. For example, the light emitting elements LD may be arranged in various forms, such as being irregularly arranged. In addition, in FIG. 3, the unit light emitting region may be a pixel region including one pixel PXL of a light emitting display panel.

Referring to FIGS. 3 and 4, the display device may include the substrate SUB, the pixel circuit layer PCL, and the display element layer DPL. The display device according to an embodiment of the present invention may be manufactured by the method of manufacturing the display device described above.

To avoid duplicate description, description of the display device according to the present embodiment will be given focusing on configurations not mentioned in the method of manufacturing the display device according to embodiments of the present invention. Configurations not specifically described with respect to the present embodiment are in accordance (e.g., are the same or are substantially the same) as the above-described embodiments. The same reference numerals denote the same components, and similar reference numerals denote similar components.

The display element layer DPL may include the first electrode EL1, the insulating pattern INSP, the light emitting elements LD, and the second electrode EL2. The first electrode EL1 may be provided on the substrate SUB, and the first electrode EL1 may include the reflective layer RL provided on the substrate SUB and the transparent conductive layer TEL provided on the reflective layer RL. For example, the first electrode EL1 may be provided on the pixel circuit layer PCL, which is provided on the substrate SUB.

The insulating pattern INSP may be provided on the first electrode EL1, and the insulating pattern INSP may include a cured product of the photoresist composition. The long axis L of the light emitting elements LD may be disposed along (e.g., parallel or substantially parallel to) the direction from the substrate SUB toward the insulating pattern INSP by the insulating pattern INSP. Accordingly, one end of the light emitting elements LD may face the substrate SUB, and the other end of the light emitting elements LD may be exposed by the insulating pattern INSP. The second electrode EL2 may be electrically connected to the other end of the light emitting elements LD exposed by the insulating pattern INSP. The overcoat layer OC may be provided on the second electrode EL2.

Referring to FIG. 4, in an embodiment of the present invention, the pixel circuit layer PCL may be provided on one surface of the substrate SUB.

The pixel circuit layer PCL may include a buffer layer BFL, a first transistor T1, a second transistor T2, and the driving voltage line DVL.

The buffer layer BFL may be provided on one surface of the substrate SUB. The buffer layer BFL may prevent (or substantially prevent) impurities from being diffused into the first and second transistors T1 and T2. The buffer layer BFL may be provided as a single layer or may be provided as multiple layers (e.g., at least two layers). When the buffer layer BFL is formed of multiple layers, each layer may be formed of the same material or different materials from each other. The buffer layer BFL may be omitted depending on material of the substrate SUB and process conditions.

The first transistor T1 may be a driving transistor electrically connected to each of the light emitting elements LD to drive the light emitting elements LD. The second transistor T2 may be a switching transistor electrically connected to the first transistor T1 to switch the first transistor T1.

Each of the first and second transistors T1 and T2 may include a semiconductor layer SCL, a gate electrode GE, a source electrode SE, and a drain electrode DE.

The semiconductor layer SCL may be provided on the buffer layer BFL. The semiconductor layer SCL may include a source region and a drain region that are in contact with the corresponding source and drain electrodes SE and DE, respectively. A region between the source region and the drain region of the semiconductor layer SCL may be a channel region. The semiconductor layer SCL may be a semiconductor pattern including (or made of) polysilicon, amorphous silicon, an oxide semiconductor, or the like. The channel region may be a semiconductor pattern doped with an impurity. As the impurity, an n-type impurity, a p-type impurity, a metal impurity, and/or the like may be used.

The gate electrode GE may be provided on the semiconductor layer SCL with a first gate insulating layer GI1 interposed therebetween.

The source electrode SE and the drain electrode DE included in the first transistor T1 may be connected to the source region and the drain region of the corresponding semiconductor layer SCL through contact openings (e.g., contact holes) penetrating both a second gate insulating layer GI2 and the first gate insulating layer GI1.

The source electrode SE and the drain electrode DE included in the second transistor T2 may be connected to the source region and the drain region of the corresponding semiconductor layer SCL through contact openings (e.g., contact hole) penetrating both the second gate insulating layer GI2 and the first gate insulating layer GI1.

The driving voltage line DVL may be provided on the first gate insulating layer GI1. However, the position of the driving voltage line DVL is not particularly limited. A signal corresponding to a driving voltage may be supplied to the driving voltage line DVL from a driving unit (e.g., a driver).

The pixel circuit layer PCL may further include a passivation layer PSV covering the first and second transistors T1 and T2. The passivation layer PSV may include at least one of an inorganic insulating layer including an inorganic material and an organic insulating layer including an organic material. For example, the passivation layer PSV may include the inorganic insulating layer and the organic insulating layer formed on the inorganic insulating layer.

FIGS. 5A to 5C show examples of a pixel constituting an active light emitting display panel. In an embodiment of the present invention, the unit light emitting region may be a pixel region in which one sub-pixel is provided.

Referring to FIG. 5A, a sub-pixel SP may include at least one light emitting element LD and a pixel driving circuit 144 connected thereto to drive the light emitting element LD.

A first electrode (e.g., an anode electrode) of the light emitting element LD may be connected to a first driving power source VDD via the pixel driving circuit 144, and a second electrode (e.g., a cathode electrode) of the light emitting element LD may be connected to a second driving power source VSS.

The first driving power source VDD and the second driving power source VSS may have different potentials from each other. For example, in comparison with the potential of the first driving power source VDD, the potential of the second driving power source VSS may be as low as a threshold voltage of the light emitting element LD.

Each light emitting element LD may emit light at a luminance corresponding to a driving current controlled by the pixel driving circuit 144.

FIG. 5A shows an example in which only one light emitting element LD is included in the sub-pixel SP, but the present invention is not limited thereto. For example, the sub-pixel SP may include a plurality of light emitting elements LD connected in parallel to each other.

According to an embodiment of the present invention, the pixel driving circuit 144 may include the first transistor T1, the second transistor T2, and a storage capacitor Cst. However, the structure of the pixel driving circuit 144 is not limited to the embodiment shown in FIG. 5A.

The first transistor T1 (e.g., the driving transistor) may include a first electrode electrically connected to the first driving power source VDD and a second electrode electrically connected to the first electrode of each of the light emitting elements LD. A gate electrode of the first transistor T1 may be connected to a first node N1. The first transistor T1 may control the amount of driving current supplied to the light emitting element LD in response to a voltage at the first node N1.

The second transistor T2 (e.g., the switching transistor) may include a first electrode connected to a data line DL and a second electrode connected to the first node N1. The first electrode and the second electrode of the second transistor T2 may be different electrodes. For example, when the first electrode is a source electrode, the second electrode may be a drain electrode. A gate electrode of the second transistor T2 may be connected to a scan line SL.

The second transistor T2 may be turned on when a scan signal having a voltage (e.g., a low voltage) at which the second transistor T2 is turned on is supplied from the scan line SL to electrically connect the data line DL and the first node N1. At this time, a data signal of the corresponding frame may be supplied to the data line DL, and the data signal may be transmitted to the first node N1. The data signal transmitted to the first node N1 may be charged in the storage capacitor Cst.

One electrode of the storage capacitor Cst may be connected to the first driving power source VDD, and the other electrode of the storage capacitor Cst may be connected to the first node N1. The storage capacitor Cst may be charged with a voltage corresponding to the data signal supplied to the first node N1, and the charged voltage may be maintained until a data signal of the next frame is supplied.

For convenience, the pixel driving circuit 144 having a relatively simple structure is shown in FIG. 5A. Referring to FIG. 5A, for example, the pixel driving circuit 144 may include the second transistor T2 for transferring the data signal into the sub-pixel SP, the storage capacitor Cst for storing the data signal, and the first transistor T1 for supplying the driving current corresponding to the data signal to the light emitting element LD.

However, the present invention is not limited thereto, and the structure of the pixel driving circuit 144 may be variously modified. In another embodiment, the pixel driving circuit 144 may further include other circuit elements. For example, the pixel driving circuit 144 may further include at least one of a transistor element for compensating a threshold voltage of the first transistor T1, a transistor element for initializing the first node N1, and a transistor element for controlling light emission time of the light emitting element LD. In addition, the pixel driving circuit 144 may further include a boosting capacitor for boosting the voltage at the first node N1.

In FIG. 5A, the transistors included in the pixel driving circuit 144, for example, the first and second transistors T1 and T2, are illustrated as P-type transistors, but the present invention is not limited thereto. For example, at least one of the first and second transistors T1 and T2 included in the pixel driving circuit 144 may be an N-type transistor.

Referring to FIG. 5B, according to an embodiment of the present invention, the first and second transistors T1 and T2 may be implemented as N-type transistors. The pixel driving circuit 144 shown in FIG. 5B is similar in structure or operation to the pixel driving circuit 144 of FIG. 5A except that the connection positions of some components are changed due to different type of the transistors. Therefore, detailed description thereof will be omitted.

Referring to FIG. 5C, the sub-pixel SP may include the first transistor T1 (e.g., the driving transistor), the second transistor T2 (e.g., the switching transistor), a third transistor T3 (e.g., a sensing transistor), the storage capacitor Cst, and the light emitting element LD.

In FIG. 5C, the first transistor T1, the second transistor T2, and the third transistor T3 are illustrated as N-type transistors, but the present invention is not limited thereto. For example, at least one of the first transistor T1, the second transistor T2, and the third transistor T3 may be a P-type transistor.

The first transistor T1 may include a first electrode that is electrically connected to the first driving power source VDD and a second electrode that is electrically connected to the first electrode of each of the light emitting elements LD. The gate electrode of the first transistor T1 may be connected to the second electrode of the second transistor T2. The first transistor T1 may determine (e.g., may sense or measure) the magnitude of the driving current flowing to the light emitting element LD according to the magnitude of the data voltage (e.g., the data signal) stored in the storage capacitor Cst.

The gate electrode of the second transistor T2 may be connected to the scan line SL. The second transistor T2 may transfer the data voltage to the sub-pixel SP according to a scan signal supplied to the scan line SL. The first electrode of the second transistor T2 may be connected to the data line DL, and the second electrode of the second transistor T2 may be connected to the gate electrode of the first transistor T1. The data voltage transferred through the second transistor T2 may be stored in the storage capacitor Cst.

A gate electrode of the third transistor T3 may be connected to a sensing line SSL. A first electrode of the third transistor T3 may be connected to an initialization power source Vint, and the second electrode of the third transistor T3 may be connected to the first electrode of the light emitting element LD. The third transistor T3 may transfer an initialization voltage to the sub-pixel SP according to a sensing signal supplied to the sensing line SSL or may sense a voltage value at the first electrode (e.g., the anode electrode) of the light emitting element LD.

The storage capacitor Cst may be connected between the gate electrode of the first transistor T1 and the first electrode of the light emitting element LD. The storage capacitor Cst may store a voltage corresponding to the data voltage applied through the second transistor T2 and the threshold voltage of the first transistor T1.

The first electrode (e.g., the anode electrode) of the light emitting element LD may be connected to the first transistor T1, and the second electrode (e.g., the cathode electrode) of the light emitting element LD may be connected to the second driving power source VSS. The light emitting element LD may generate light having a luminance corresponding to (or according to) the amount of current supplied from the first transistor T1.

A parasitic capacitor $C_{LD}$ may be generated between the first electrode and the second electrode of the light emitting element LD. When the parasitic capacitor $C_{LD}$ is charged, the light emitting element LD may easily emit light even in response to a relatively small current. When the initialization power source Vint is supplied to the anode electrode of the light emitting element LD through the third transistor T3, the parasitic capacitor $C_{LD}$ may be discharged, thereby improving the black expression capability of the display device.

Referring to FIG. 4, the first electrode EL1 provided on the passivation layer PSV of the pixel circuit layer PCL may be electrically connected to at least one of the plurality of transistors included in the pixel circuit layer PCL. For example, the transparent conductive layer TEL of the first electrode EL1 may be electrically connected to the drain electrode DE of the first transistor T1 through a first contact opening (e.g., a first contact hole) CH1 penetrating the passivation layer PSV.

In addition, the second electrode EL2 may be electrically connected to the driving voltage line DVL through a second contact opening (e.g., a second contact hole) CH2 penetrating the passivation layer PSV and the second gate insulating layer GI2.

As described above, the drain electrode DE of the first transistor T1 may be electrically connected to the first electrode EL1 through the first contact opening CH1. Thus, the first electrode EL1 may receive a signal from the first transistor T1.

The driving voltage line DVL may be electrically connected to the second electrode EL2 through the second contact opening CH2. Thus, the second electrode EL2 may receive a signal from the driving voltage line DVL.

One end of the light emitting element LD may contact the first electrode EL1, and the other end of the light emitting element LD may contact the second electrode EL2. Accordingly, the light emitting element LD may receive a voltage (e.g., a predetermined voltage) through the first electrode EL1 and the second electrode EL2. When an electric field equal to or greater than the voltage is applied to the both ends of the light emitting element LD, the light emitting element LD may emit light by a combination of electron-hole pairs in the active layer 12.

In an embodiment of the present invention, the first electrode EL1 may include the reflective layer RL and the transparent conductive layer TEL, and the second electrode EL2 may be a transparent electrode.

The second electrode EL2 may be made of a transparent conductive material so that the light emitted from the other end of the light emitting elements LD may proceed in a direction (e.g., a front direction) opposite to the pixel circuit layer PCL without loss (or substantial loss).

The transparent conductive layer TEL may include (or may be made of) a transparent conductive material so that the light emitted from one end of the light emitting elements LD may proceed to the reflective layer RL without loss (or substantial loss).

The transparent conductive material constituting the second electrode EL2 and the transparent conductive layer TEL may include, for example, ITO, IZO, ITZO, or the like. However, the materials of the second electrode EL2 and the transparent conductive layer TEL are not limited to the above-described materials.

The reflective layer RL may reflect the light emitted from one end of the light emitting elements LD in a direction (e.g., the front direction) toward the second electrode EL2. The reflective layer REL may include a conductive material having high light reflectance. For example, the reflective layer REL may include a single layer made of Ag or a triple layer including ITO/Ag/ITO.

The insulating pattern INSP may be made of a transparent insulating material so that the light emitted from one end of the light emitting elements LD may proceed to the front direction without loss (or substantial loss). For example, the cured product of the photoresist composition may form a transparent insulator.

In an embodiment of the present invention, the light emitted from the light emitting elements LD may be emitted toward the front direction.

Figure 6:
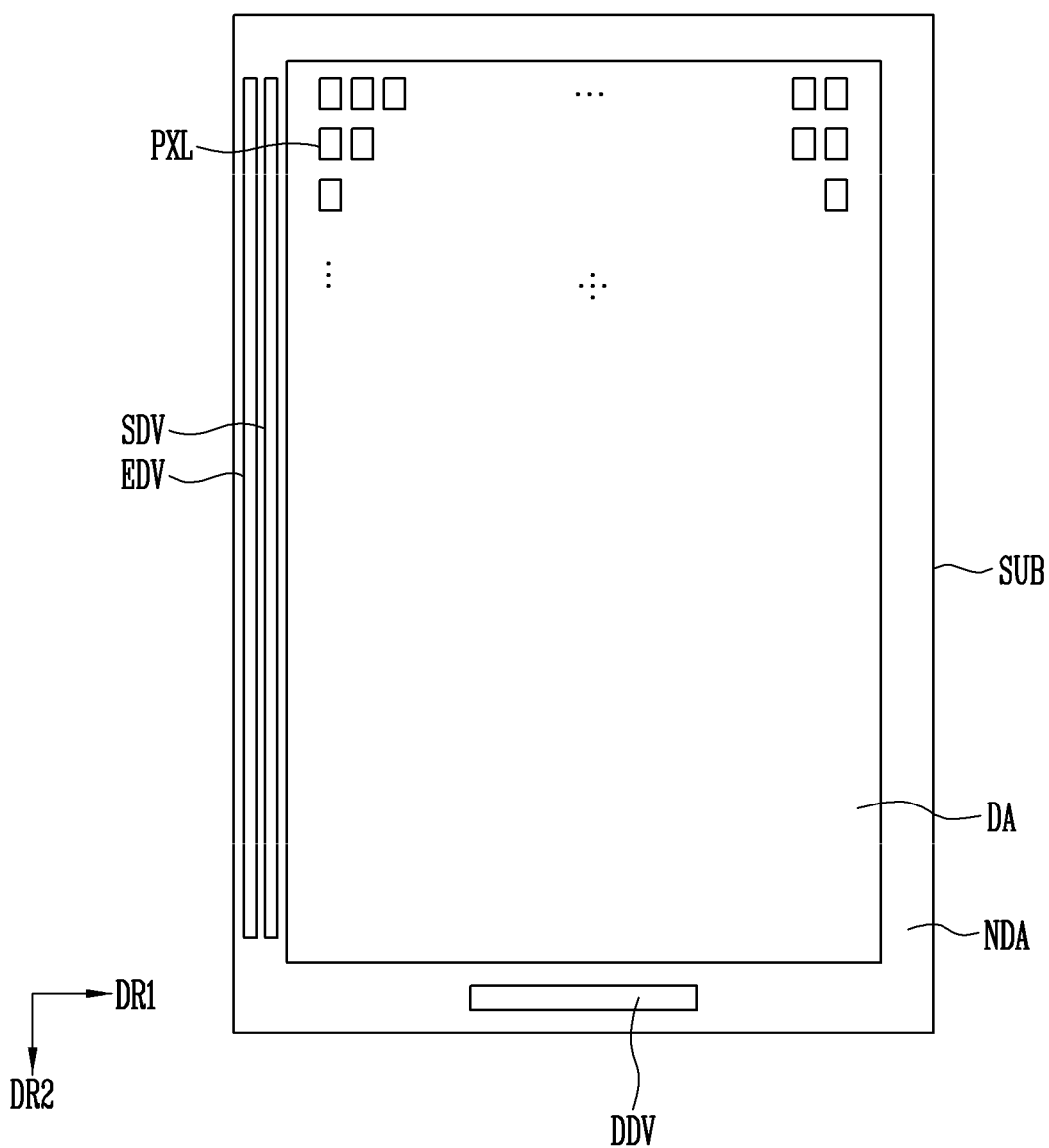
FIG. 6 is a plan view illustrating a display device according to an embodiment of the present invention.

FIG. 6 is a plan view illustrating the display device according to the embodiment of the present invention. The display device shown in FIG. 6 using the light emitting element LD illustrated in FIG. 1A or 1B as a light emitting source is schematically illustrated.

Referring to FIGS. 1A, 1B, and 6, the display device according to an embodiment of the present invention may include the substrate SUB, pixels PXL provided on one surface of the substrate SUB, and a driving unit (e.g., a driver) provided on the substrate SUB and configured to drive the pixels PXL, and a wiring unit (e.g., wirings) connecting the pixels PXL to the driving unit.

The substrate SUB may include a display area DA and a non-display area NDA. The display area DA may be an area at where the pixels PXL for displaying an image are provided. The non-display area NDA may be an area in which the driving unit for driving the pixels PXL and a portion of the wiring unit for connecting the pixels PXL and the driving unit are provided.

The pixels PXL may be provided in the display area DA on the substrate SUB. Each of the pixels PXL may be provided in plural as a minimum (or smallest) unit for displaying the image. The pixels PXL may include the light emitting element LD that emits white light and/or color light. Each of the pixels PXL may emit one of red, green, and blue colors, but the present invention is not limited thereto. For example, each of the pixels PXL may emit one of cyan, magenta, yellow, and white colors.

The pixels PXL may be provided in plural and arranged in a matrix form along rows extending in a first direction DR1 and columns extending in a second direction DR2 crossing (e.g., perpendicular to) the first direction DR1. However, the arrangement form of the pixels PXL is not particularly limited and may have various forms.

The driving unit may provide a signal to each of the pixels PXL through the wiring unit. Accordingly, the driving of each of the pixels PXL may be controlled. In FIG. 6, the wiring unit is omitted for convenience of description.

The driving unit may include a scan driver SDV configured to provide scan signal to the pixels PXL through the scan line, an emission driver EDV configured to provide an emission control signal to the pixels PXL through an emission control line, a data driver DDV configured to provide the data signal to the pixels PXL through the data line, and a timing controller. The timing controller may control the scan driver SDV, the emission driver EDV, and the data driver DDV.

The display device according to the embodiments of the present invention may be employed in various electronic devices. For example, the display device may be applied to various devices, such as a television, a laptop, a mobile phone, a smart phone, a smart pad (PD), a personal media player (PMP), a personal device assistant (PDA), a navigation device, a smart watch, and the like.

According to embodiments of the present invention, a simplified method of manufacturing a display device and a display device manufactured via the simplified method are provided.

The foregoing detailed description illustrates and describes embodiments of the present invention, but the foregoing detailed description merely illustrates and describes some embodiments of the present invention. As described above, aspects and features of the present invention can be used in various other combinations, changes, and environments, and can be variously changed or modified within the scope of the inventive concept disclosed herein, the equivalents of the written disclosures, and/or the scope of the skill or knowledge of the art. Accordingly, the foregoing detailed description of the present invention is not intended to limit the present invention to the disclosed embodiments. Also, the appended claims should be construed as including other embodiments, including their equivalents, as well.

What is claimed is:

1. A method of manufacturing a display device, the method comprising:
   forming a first electrode on a substrate;
   forming an insulating layer on the substrate and on the first electrode;
   providing light emitting elements in the insulating layer, each of the light emitting elements having a long axis and a short axis crossing the long axis and being configured to emit light;
   aligning the light emitting elements by disposing an alignment electrode over the insulating layer and applying power to each of the first electrode and the alignment electrode to align the light emitting elements such that one end of each of the light emitting elements faces the substrate and the long axis of each of the light emitting elements is arranged in a direction from the substrate toward the insulating layer;

patterning the insulating layer to form an insulating pattern exposing another end of each of the light emitting elements; and forming a second electrode electrically connected to the exposed other end of each of the light emitting elements.

2. The method of claim 1, wherein the forming of the first electrode comprises:

forming a reflective layer on the substrate; and forming a transparent conductive layer on the reflective layer.

3. The method of claim 1, wherein the forming of the insulating layer comprises applying a photoresist composition on the substrate and on the first electrode.

4. The method of claim 3, wherein the forming of the insulating layer and the providing of the light emitting elements are concurrently performed by using the photoresist composition comprising the light emitting elements.

5. The method of claim 3, wherein the patterning of the insulating layer to form the insulating pattern comprises selectively exposing and developing the insulating layer by using a mask.

6. The method of claim 5, wherein the patterning of the insulating layer to form the insulating pattern comprises using a halftone mask or a slit mask to form the insulating pattern.

7. The method of claim 1, wherein the patterning of the insulating layer to form the insulating pattern comprises forming the insulating pattern in each pixel region of the substrate.

8. The method of claim 1, further comprising drying the insulating layer under reduced pressure to fix the aligned light emitting elements after the aligning of the light emitting elements.

9. The method of claim 8, further comprising heat-treating the insulating layer between the drying of the insulating layer and the patterning of the insulating layer.

10. The method of claim 9, further comprising removing the light emitting elements in a region outside of pixel regions of the substrate before the heat-treating of the insulating layer.

11. The method of claim 1, further comprising curing the insulating pattern before the forming the second electrode.

* * * * *